(12) United States Patent
Uemura et al.

(10) Patent No.: US 9,831,210 B2
(45) Date of Patent: Nov. 28, 2017

(54) ELECTRONIC DEVICE AND ELECTRONIC APPARATUS

(71) Applicant: FUJITSU LIMITED, Kawasaki-shi, Kanagawa (JP)

(72) Inventors: Taiki Uemura, Kawasaki (JP); Seiki Sakuyama, Yamato (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/362,246

(22) Filed: Nov. 28, 2016

(65) Prior Publication Data

US 2017/0207186 A1    Jul. 20, 2017

(30) Foreign Application Priority Data

Jan. 15, 2016    (JP) .................................. 2016-006043

(51) Int. Cl.
*H01L 23/48*    (2006.01)
*H01L 23/52*    (2006.01)
(Continued)

(52) U.S. Cl.
CPC ............ *H01L 24/17* (2013.01); *B23K 35/262* (2013.01); *B23K 35/302* (2013.01); *C22C 9/02* (2013.01); *C22C 13/00* (2013.01); *C22C 28/00* (2013.01); *H01L 24/11* (2013.01); *H01L 24/81* (2013.01); *H01L 2224/0401* (2013.01); *H01L 2224/05147* (2013.01); *H01L 2224/13082* (2013.01); *H01L 2224/13109* (2013.01); *H01L 2224/13111* (2013.01); *H01L 2224/13139* (2013.01); *H01L 2224/13147* (2013.01);
(Continued)

(58) Field of Classification Search
CPC ......... H01L 24/13; H01L 24/15; H01L 24/16; H01L 24/27; H01L 2924/01047; H01L 2924/10149; H01L 2924/1015; H01L 2224/095; H01L 2224/09505; H01L 2224/10; H01L 2224/11; H01L 2224/1308; H01L 2224/13101; H01L 2224/13109; H01L 2224/13111; H01L 2224/13147; H01L 2224/13139
USPC ......... 438/107, 108, 613–615; 257/737, 741, 257/750, 762, 772
See application file for complete search history.

(56) References Cited

U.S. PATENT DOCUMENTS 8,450,859 B2 *    5/2013    Ohashi .................. H01L 21/563
   257/779
2010/0266870 A1    10/2010    Nishimura
(Continued)

FOREIGN PATENT DOCUMENTS

JP    61-148774    7/1986
JP    09-155586    6/1997
(Continued)

*Primary Examiner* — Hsien Ming Lee
(74) *Attorney, Agent, or Firm* — Fujitsu Patent Center

(57) ABSTRACT

An electronic device includes an electrode including Cu, a solder including Sn and provided above the electrode, and a joining layer including In and Ag and provided along a boundary between the electrode and the solder. The joining layer including In and Ag prevents Cu—Sn alloy, such as $Cu_6Sn_5$, from being formed at the boundary between the electrode and the solder, and prevents generation of voids and cracks resulting from the Cu—Sn alloy. The electrode and the solder are joined with sufficient strength by the joining layer.

15 Claims, 17 Drawing Sheets

(51) Int. Cl.
   *H01L 21/44*     (2006.01)
   *H01L 23/00*     (2006.01)
   *B23K 35/26*     (2006.01)
   *B23K 35/30*     (2006.01)
   *C22C 28/00*     (2006.01)
   *C22C 9/02*      (2006.01)
   *C22C 13/00*     (2006.01)

(52) U.S. Cl.
   CPC ............ *H01L 2224/16145* (2013.01); *H01L 2224/16227* (2013.01); *H01L 2224/81815* (2013.01); *H01L 2924/014* (2013.01)

(56) References Cited

U.S. PATENT DOCUMENTS

2016/0163668 A1* 6/2016 Hine ................. H01L 24/17
                                                  174/257
2016/0233181 A1* 8/2016 Uemura ............. H01L 24/05

FOREIGN PATENT DOCUMENTS

| JP | 2011-005542 | 1/2011 |
| JP | 2013-233577 | 11/2013 |
| WO | 2009/051255 | 4/2009 |

* cited by examiner

ELECTRONIC DEVICE AND ELECTRONIC APPARATUS

CROSS-REFERENCE TO RELATED APPLICATION

This application is based upon and claims the benefit of priority of the prior Japanese Patent Application No. 2016-006043, filed on Jan. 15, 2016, the entire contents of which are incorporated herein by reference.

FIELD

The embodiments discussed herein relate to an electronic device and an electronic apparatus.

BACKGROUND

There is a known technology that uses solder to join electrodes together. Solder including tin (Sn) and Pb-free solder that does not include lead (Pb) are known as the solder that is used to join electrodes. Also, low melting point solder of a comparatively low melting point, such as solder including indium (In) and solder obtained by adding an element such as silver (Ag) to the solder including indium (In), is known.

See, for example, Japanese Laid-open Patent Publication Nos. 2013-233577 and 2011-005542, and International Publication Pamphlet No. WO 2009/051255.

When the solder including Sn is joined with an electrode including copper (Cu) so as to form alloy of Cu and Sn at a boundary between the solder and the electrode, voids and cracks tend to be formed at the boundary, decreasing joint reliability between the solder and the electrode.

SUMMARY

According to one aspect, there is provided an electronic device including: an electrode including Cu; a solder including Sn and provided above the electrode; and a joining layer including In and Ag and provided along a boundary between the electrode and the solder.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
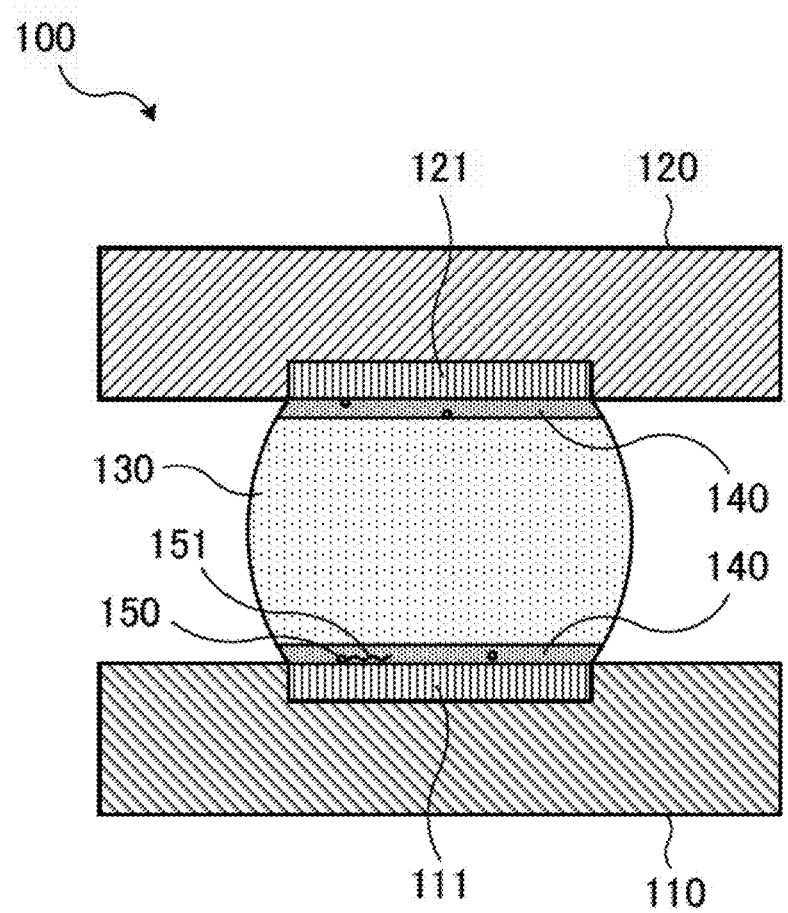
FIG. 1 illustrates an example of an electronic device.

Several embodiments will be described below with reference to the accompanying drawings, wherein like reference numerals refer to like elements throughout. First, one form of joint between an electrode and solder will be described.

FIG. 1 illustrates an example of the electronic device. FIG. 1 schematically illustrates a cross section of a main part of the electronic device. An electronic device 100 illustrated in FIG. 1 includes an electronic component 110, an electronic component 120, and a solder 130.

The electronic component 110 includes an electrode 111. The electronic component 120 is provided to face the electronic component 110 and includes an electrode 121 at a position corresponding to the electrode 111 of the electronic component 110. Cu is included in the electrode 111 and the electrode 121. The solder 130 is joined with the electrode 111 and the electrode 121. Sn is included in the solder 130.

In recent years, Pb-free solder is used as the solder 130 in consideration of environment. For example, Sn—Ag based solder that includes Sn and Ag and Sn—Ag—Cu based solder that additionally includes Cu can be used as the solder 130. Besides, Sn—In based solder that includes Sn and In and Sn—Bi based solder that includes Sn and bismuth (Bi) can also be used as the solder 130, in view of reduction of joining temperature.

When the solder 130 including Sn is joined with the electrode 111 and the electrode 121 including Cu, Cu—Sn alloys 140 can be formed along boundaries between the solder 130 and both of the electrode 111 and the electrode 121. For example, each of the Cu—Sn alloys 140 can be an intermetallic compound such as $Cu_6Sn_5$ and $Cu_3Sn$, or the same intermetallic compound into which other elements, such as In, are mixed additionally.

Both of the electrode 111 and the electrode 121 are joined with the solder 130 by the Cu—Sn alloys 140 formed along the boundaries between the solder 130 and both of the electrode 111 and the electrode 121. However, on the other hand, because of the shape of the solder 130 of the joint structure, stress easily concentrates at the boundaries between the solder 130 and both of the electrode 111 and the electrode 121 when heat or external force is applied, and the boundaries between the solder 130 and both of the electrode 111 and the electrode 121 tend to become a starting point of destruction. Hence, the Cu—Sn alloys 140 formed along the boundaries between the solder 130 and both of the electrode 111 and the electrode 121 influence the reliability of the joint between the electronic component 110 and the electronic component 120.

For example, when the Cu—Sn alloys 140 include $Cu_6Sn_5$ which is an intermetallic compound of Cu and Sn, the volume of $Cu_6Sn_5$ changes with phase transformation associated with temperature change. The volume change due to the phase transformation of $Cu_6Sn_5$ can cause a void 150 at the boundary between the solder 130 and the electrode 111 or the electrode 121. When the void 150 occurs, it is possible that a crack 151 occurs at the boundary between the solder 130 and the electrode 111 or the electrode 121, due to stress resulting from the shapes of the void 150 and the solder 130, thereby reducing the reliability of the joint between the electronic component 110 and the electronic component 120.

Figure 2:
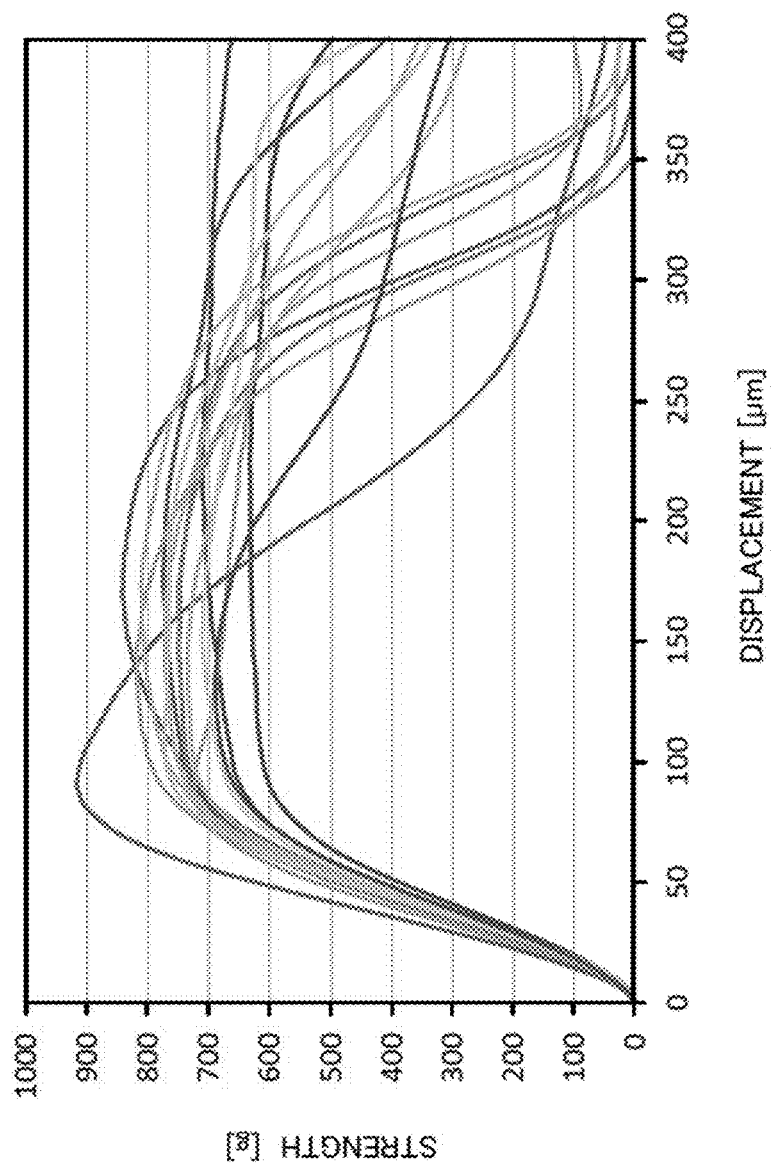
FIG. 2 illustrates an example of a high speed shear test result.

FIG. 2 illustrates an example of a high speed shear test result. FIG. 2 illustrates a result of a high speed shear test of solder, which was performed to a specimen group in which solders including Sn (corresponding to the above solder 130) are joined on Cu electrodes (corresponding to the above electrode 111 or the electrode 121) in the same condition that Cu—Sn alloys (corresponding to the above Cu—Sn alloys 140) are formed along the boundaries.

The high speed shear test measures strength (load) when solder on an electrode is broken (sheared) with a shear tool, under a condition that a shear position of the solder by the shear tool is at a height of 100 µm from the electrode and that a shear speed of the shear tool is 3000 mm/sec. In FIG. 2, the horizontal axis represents displacement [µm] of the shear tool, and the vertical axis represents strength [g].

FIG. 2 reveals that even the specimen group that joins the solders and the electrodes in the same condition has comparatively large variation in peak values of the strength and comparatively large variation in up-down behavior of the strength associated with the displacement. When the solders and the electrodes are joined by Cu—Sn alloys formed at the boundaries, the joining strength between the solders and the electrodes varies as in the specimen group that obtains the result of FIG. 2, thereby failing in providing a highly reliable joint.

It is possible that the variation of the joining strength and the decrease of the joint reliability result in decrease of reliability and decrease of yield rates of an electronic component that includes a joint structure between the solder and the electrode, of an electronic device that uses such an electronic component, and of an electronic apparatus that uses such an electronic device.

Note that there is a proposed method that prevents generation of cracks resulting from the phase transformation of the intermetallic compound at the boundary between the solder and the electrode, by adding nickel (Ni) to the solder including Sn and Cu in order to form $(Cu, Ni)_6Sn_5$ at the boundary between the electrode and the solder. However, voids tend to occur at the boundary between $(Cu, Ni)_6Sn_5$ or $Cu_6Sn_5$ and $Cu_3Sn$ that can be formed together with $(Cu, Ni)_6Sn_5$ or $Cu_6Sn_5$, and thus cracks tend to occur due to the stress resulting from the voids and the solder shape. Also, in this method, the melting point of the solder exceeds a temperature of 200° C., and the joining temperature becomes comparatively high.

As described above, the Cu—Sn alloy including the intermetallic compound of Cu and Sn is formed at the boundary between the solder including Sn and the electrode including Cu, and the Cu—Sn alloy has an influence on the reliability of the joint between the solder and the electrode. In view of the joint reliability, it is preferable to prevent the Cu—Sn alloy, which can cause voids and cracks, from being formed at the boundary between the solder and the electrode. Note that, if the joining layer of the Cu—Sn alloy is not formed along the boundary, it is concerned that the joining strength between the solder and the electrode significantly decreases.

In consideration of the above point, a technology illustrated with below embodiments is employed here, in order to configure a joint structure that is superior in joining strength and joint reliability between the solder and the electrode, an electronic component that includes such a joint structure, and an electronic device or an electronic apparatus that uses such an electronic component.

Figure 3:
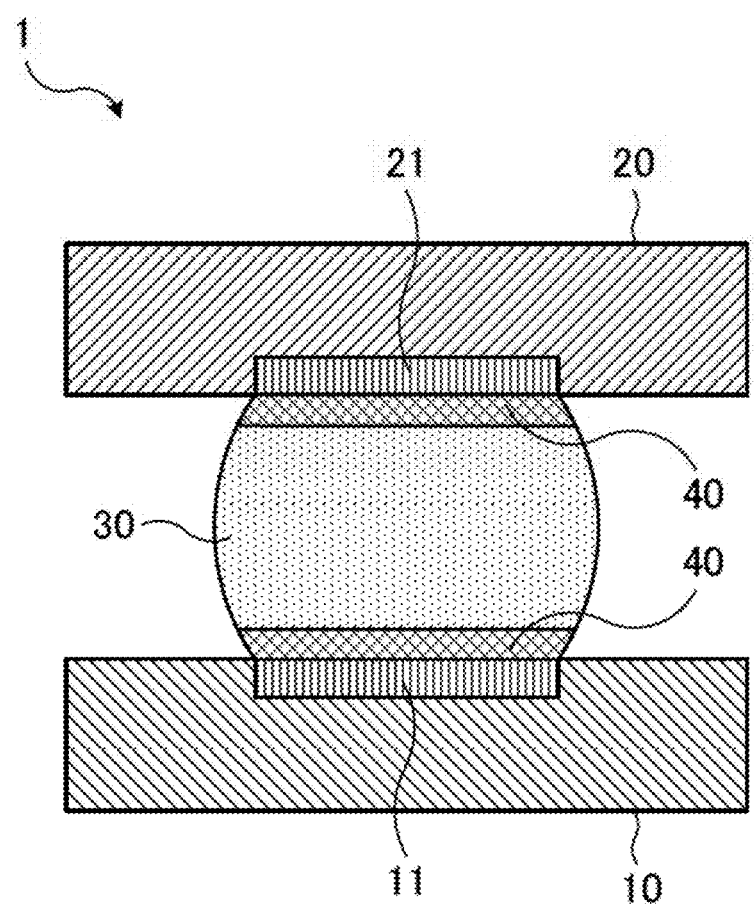
FIG. 3 illustrates an example of the electronic device according to a first embodiment.

First, a first embodiment will be described. FIG. 3 illustrates an example of an electronic device according to the first embodiment. FIG. 3 schematically illustrates a cross section of a main part of the electronic device according to the first embodiment. The electronic device 1 illustrated in FIG. 3 includes an electronic component 10, an electronic component 20, and a solder 30.

The electronic component 10 includes an electrode 11. The electronic component 20 is provided to face the electronic component 10 and includes an electrode 21 at a position corresponding to the electrode 11 of the electronic component 10. Cu is included in the electrode 11 and the electrode 21. Ni, gold (Au), or the like may be included in the electrode 11 and the electrode 21, in addition to Cu. Note that FIG. 3 illustrates a pair of corresponding electrodes 11 and 21, but a plurality of pairs of corresponding electrodes 11 and 21 may be provided in the electronic component 10 and the electronic component 20.

Sn is included in the solder 30. For example, the solder 30 includes Sn, In, Ag, and Cu. Sn—In solder is a species of Pb-free low-melting-point solder, to which a certain amount of Ag and a certain amount of Cu are added to improve the mechanical strength of the solder and to refine the crystal structure of the solder.

The solder 30 is joined with the electrode 11 of the electronic component 10 and the electrode 21 of the electronic component 20. Joining layers 40 including In and Ag are formed along boundaries between the solder 30 and both of the electrode 11 and the electrode 21. The joining layers 40 include alloy including In and Ag, such as an intermetallic compound of In and Ag, or the same alloy or intermetallic compound in which other elements are mixed.

In the electronic device 1, the joining layers including In and Ag are formed along the boundaries between the solder 30 and both of the electrode 11 and the electrode 21, and thus Cu—Sn alloy is prevented from being formed due to reaction between Sn of the solder 30 and Cu of the electrodes 11 and 21. Because formation of the Cu—Sn alloy is prevented, generation of voids at the boundaries between the solder 30 and both of the electrode 11 and the electrode 21 and generation of cracks resulting from the voids are prevented. Further, in the electronic device 1, the solder 30 and both of the electrode 11 and the electrode 21 are joined with sufficient strength by the joining layers 40 including In and Ag formed along the boundaries. Thereby, the electronic device 1 is superior in joining strength and joint reliability between the solder 30 and both of the electrode 11 of the electronic component 10 and the electrode 21 of the electronic component 20.

Figure 4A:
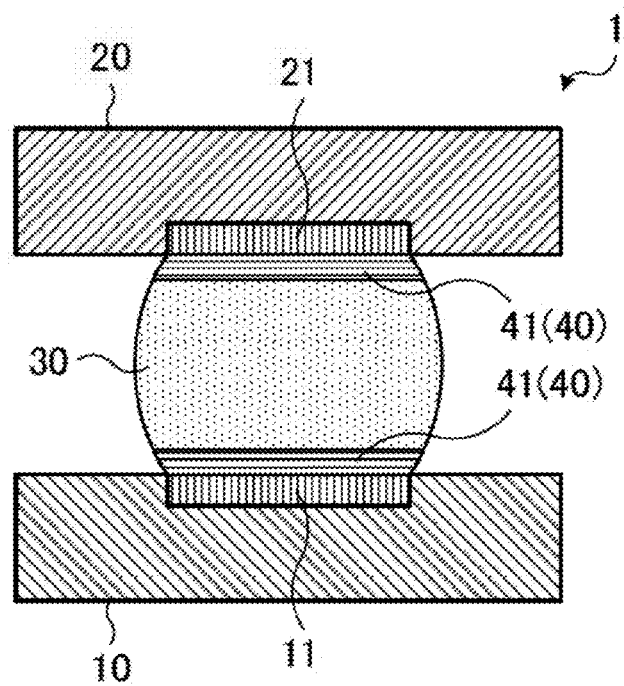
FIGS. 4A and 4B illustrate exemplary structures of the electronic device according to the first embodiment.
Figure 4B:
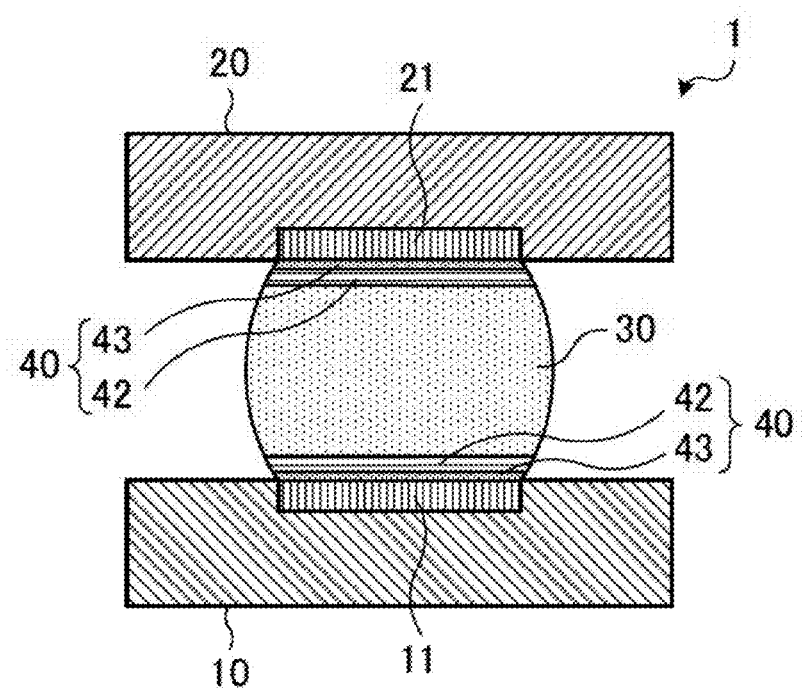

The above joining layers 40 including In and Ag have structures illustrated in FIGS. 4A and 4B, for example.

FIGS. 4A and 4B illustrate exemplary structures of the electronic device according to the first embodiment. FIG. 4A schematically illustrates a cross section of a main part of the electronic device that includes joining layers of a first exemplary structure, and FIG. 4B schematically illustrates a cross section of a main part of the electronic device that includes joining layers of a second exemplary structure.

A single layer structure of alloy layers 41 including In and Ag (In—Ag alloy layer), which is illustrated in FIG. 4A for example, may be formed as the above joining layers 40 including In and Ag, along the boundaries between the solder 30 and both of the electrode 11 of the electronic component 10 and the electrode 21 of the electronic component 20.

Here, the In—Ag alloy layers 41 are made of $AgIn_2$ which is an intermetallic compound of In and Ag, or of $AgIn_2$ mixed with other elements, for example. An element that can be mixed in $AgIn_2$ is a constituent of the solder 30 (Sn, Cu, etc. of the solder 30 including Sn, In, Ag, and Cu,) and a constituent (Cu, etc.) of the electrode 11 and the electrode 21, for example.

The In—Ag alloy layers 41 illustrated in FIG. 4A are formed along the boundaries between the solder 30 and both of the electrode 11 and the electrode 21, and thereby Cu—Sn alloy is prevented from being formed due to reaction between Sn of the solder 30 and Cu of the electrodes 11 and 21. Further, because the In—Ag alloy layers 41 illustrated in FIG. 4A are formed along the boundaries between the solder 30 and both of the electrode 11 and the electrode 21, the solder 30 and both of the electrode 11 and the electrode 21 are joined with sufficient strength. Thereby, the electronic device 1 is superior in joining strength and joint reliability.

Also, a two-layer structure composed of the In—Ag alloy layer 42 and the Cu—Sn alloy layer including Cu and Sn (Cu—Sn alloy layers) 43, which is illustrated in FIG. 4B for example, may be formed as the above joining layers 40, along the boundaries between the solder 30 and both of the electrode 11 of the electronic component 10 and the electrode 21 of the electronic component 20.

Here, the In—Ag alloy layers 42 are made of $AgIn_2$ which is an intermetallic compound of In and Ag, or of $AgIn_2$ mixed with other elements, for example. An element that can be mixed in $AgIn_2$ is a constituent of the solder 30 (Sn, Cu, etc. of the solder 30 including Sn, In, Ag, and Cu.) and a constituent (Cu, etc.) of the electrode 11 and the electrode 21, for example.

Also, the Cu—Sn alloy layers 43 are made of $Cu_6Sn_5$, of $Cu_3Sn$, of $Cu_6Sn_5$ and $Cu_3Sn$, of $Cu_2In_3Sn$, or of those mixed with other elements, for example. An element that can be mixed in $Cu_6Sn_5$, $Cu_3Sn$, or $Cu_2In_3Sn$ is a constituent of the solder 30 (In, Ag, etc. of the solder 30 including Sn, In, Ag, and Cu.) and a constituent (Cu, etc.) of the electrode 11 and the electrode 21, for example.

The Cu—Sn alloy layers 43 are formed at the electrode 11 side and the electrode 21 side, and the In—Ag alloy layers 42 are formed at the solder 30 side, as illustrated in FIG. 4B. The In—Ag alloy layers 42 are formed thicker than the Cu—Sn alloy layers 43. This is because, if the Cu—Sn alloy layers 43 are thicker than the In—Ag alloy layers 42, the Cu—Sn alloy layers 43 have a larger influence to cause generation of voids and cracks, consequent variation and decrease of joining strength, and decrease of joint reliability.

The In—Ag alloy layers 42 are formed along the boundaries between the solder 30 and both of the electrode and the electrode 21 as illustrated in FIG. 4B, and thereby formation of Cu—Sn alloy due to reaction between Sn of the solder 30 and Cu of the electrodes 11 and 21 is prevented. Further, because the In—Ag alloy layers 42 are formed along the boundaries between the solder 30 and both of the electrode 11 and the electrode 21 as illustrated in FIG. 4B, the solder 30 and both of the electrode 11 and the electrode 21 are joined with sufficient strength. Thereby, the electronic device 1 is superior in joining strength and joint reliability.

Figure 5A:
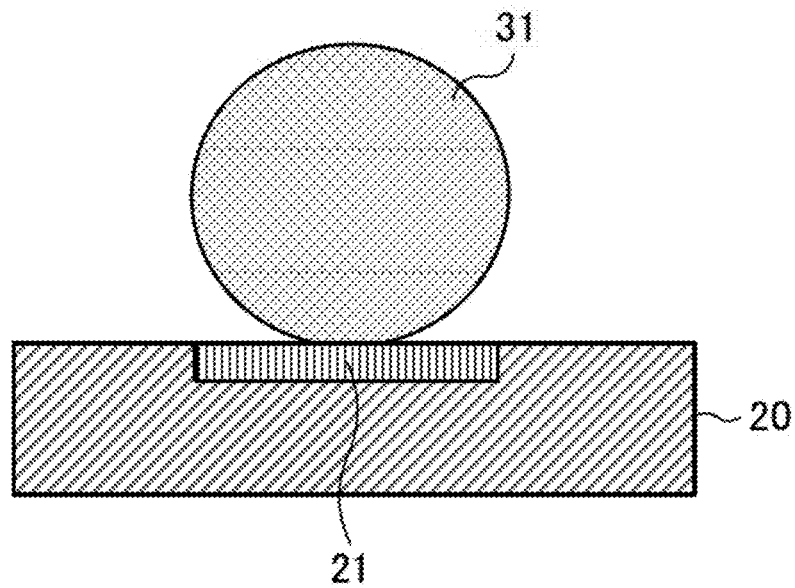
FIGS. 5A and 5B are first diagrams illustrating examples of a method for forming the electronic device according to the first embodiment.
Figure 5B:
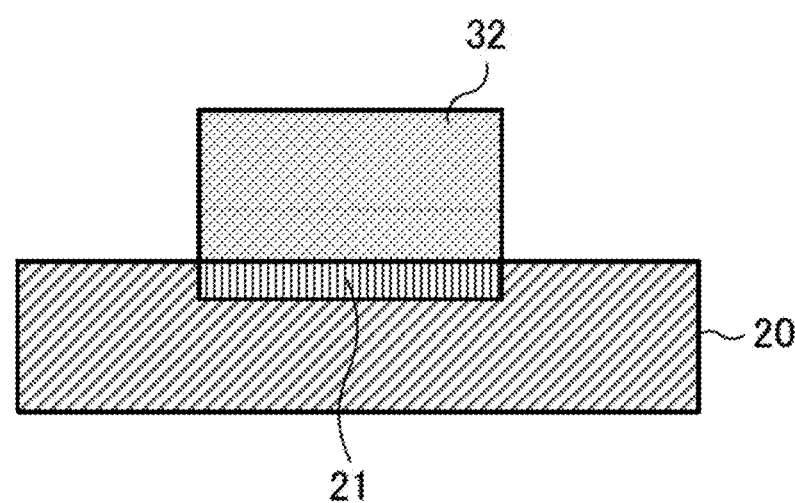
Figure 6A:
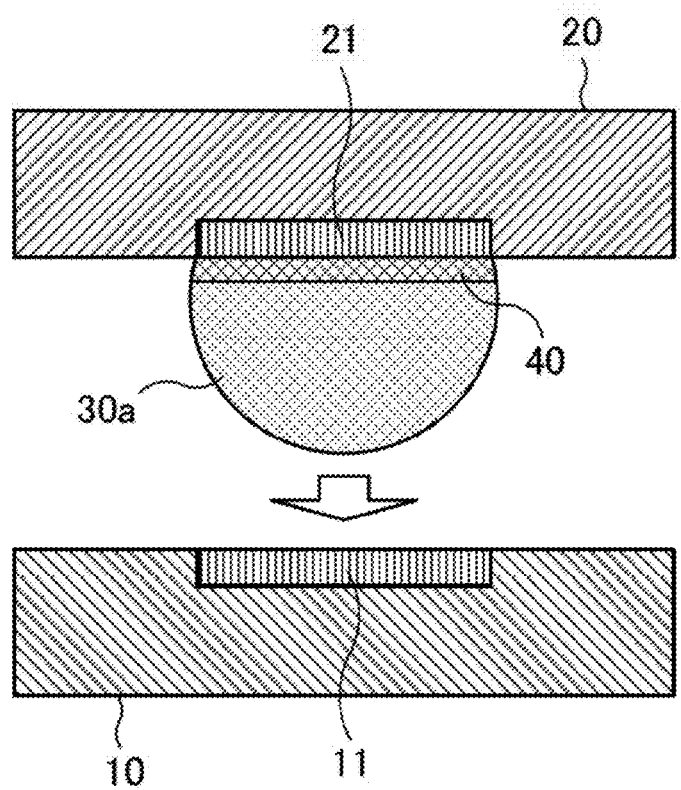
FIGS. 6A and 6B are second diagrams illustrating an example of a method for forming the electronic device according to the first embodiment.
Figure 6B:
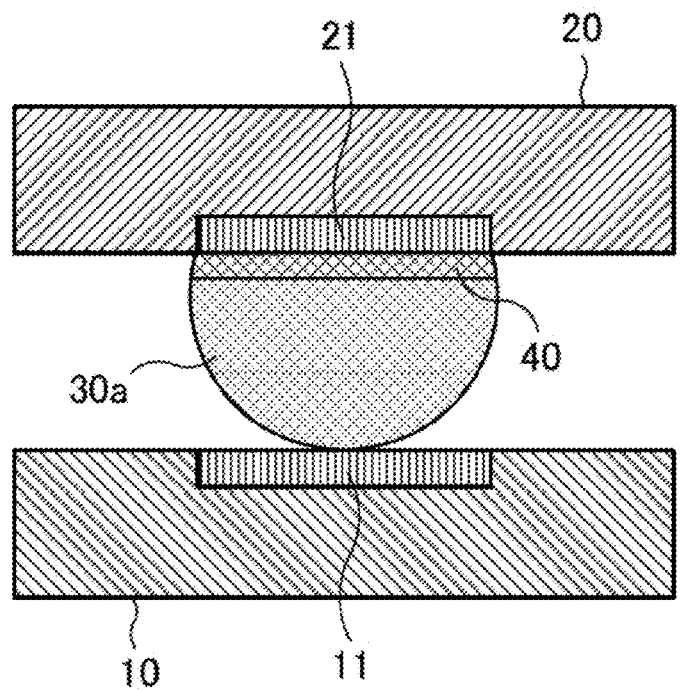

The electronic device 1 is formed by using a method illustrated in FIGS. 5A, 5B, 6A, and 6B, for example. FIGS. 5A, 5B, 6A, and 6B illustrate an example of a method for forming the electronic device according to the first embodiment. FIGS. 5A and 5B schematically illustrate cross sections of main parts in an exemplary electronic component preparation process. FIGS. 6A and 6B schematically illustrate cross sections of the main parts in an exemplary electronic component joining process.

To form the electronic device 1, there are prepared the electronic component 10 including the electrode 11, and the electronic component 20 (an electronic device) including the electrode 21 on which a solder 30a is provided, as illustrated in FIG. 6A, for example.

Here, the electronic component 20 provided with the solder 30a on the electrode 21 is prepared as described below, for example. First, a solder ball 31 is located on the electrode 21 of the electronic component 20, as illustrated in FIG. 5A. Alternatively, a solder paste 32 including solder may be located on the electrode 21 of the electronic component 20, as illustrated in FIG. 5B. Solder including Sn, In, Ag, and Cu is used in the solder ball 31 or the solder paste 32. The solder ball 31 or the solder paste 32 using this solder is put on the electrode 21, and is heated at a temperature at which the solder in the solder ball 31 or the solder paste 32 melts, and thereafter is solidified by cooling (first reflow). Thereby, the ball-shaped solder 30a is formed on the electrode 21 of the electronic component 20, as illustrated in FIG. 6A.

The joining layer 40 including In and Ag is formed along the boundary between the solder 30a and the electrode 21, as illustrated in FIG. 6A. The joining layer along the boundary between the solder 30a and the electrode 21 is formed at the time of the first reflow of the solder ball 31 or the solder paste 32 (formation of the solder 30a), and includes In and Ag which are constituents of the solder in the solder ball 31 or the solder paste 32. This joining layer 40 may include at least one of Sn and Cu which is another constituent of the solder, or Cu which is a constituent of the electrode 21. The joining layer 40 along the boundary between the solder 30a and the electrode 21 is formed in a single layer structure of the In—Ag alloy layer 41 illustrated in FIG. 4A or in a two-layer structure including the In—Ag alloy layer 42 and the Cu—Sn alloy layer 43 illustrated in FIG. 4B, for example.

In the electronic component 20, the joining layer 40 including In and Ag is formed along the boundary between the solder 30a and the electrode 21, and thereby Sn in the solder 30a is prevented from diffusing into the electrode 21 and from reacting with Cu in the electrode 21, and the Cu—Sn alloy, such as $Cu_6Sn_5$, is prevented from being formed at the boundary. This achieves the electronic component 20 that can prevent generation of voids and cracks between the solder 30a and the electrode 21 as well as variation and decrease of joining strength.

As illustrated in FIG. 6A, the electrode 21 (and the solder 30a) is adjusted to the position of the electrode 11 of the electronic component 10, so that the electronic component 20 provided with the solder 30a on the electrode 21 is located to face the electronic component 10. Thereafter, as illustrated in FIG. 6B, the solder 30a on the electrode 21 of the electronic component is brought into contact with the electrode 11 of the electronic component 10, and is heated at a temperature at which the solder 30a melts, and then is solidified by cooling (second reflow). This procedure forms the electronic device 1 illustrated in FIG. 3 in which the solder 30a on the electrode 21 of the electronic component is joined with the electrode 11 of the electronic component 10 so that the electrode 21 and the electrode 11 are connected electrically and mechanically by the solder 30.

At the time of the second reflow of the solder 30a, a boundary is formed between the solder 30 and the electrode 11 by the second reflow, and the joining layer including In and Ag is formed along the boundary between the solder 30 and the electrode 11. The joining layer 40 along the boundary between the solder 30 and the electrode 11 includes In and Ag which are constituents of the solder 30a before the second reflow. This joining layer 40 may include at least one of Sn and Cu which are other constituents of the solder 30a, or Cu which is a constituent of the electrode 11. The joining layer 40 along the boundary between the solder 30 and the electrode is formed with a single layer structure of the In—Ag alloy layer 41 illustrated in FIG. 4A or a two-layer structure including the In—Ag alloy layer 42 and the Cu—Sn alloy layer 43 illustrated in FIG. 4B, for example.

The joining layer 40 along the boundary between the solder 30 and the electrode 21 may be formed at the time of the second reflow, simultaneously with the joining layers 40 along the boundary between the solder 30 and the electrode 11.

In the electronic device 1, the joining layer 40 including In and Ag is formed along the boundary between the solder 30 and the electrode 11, and thereby Sn in the solder 30 is prevented from diffusing into the electrode 11 and from reacting with Cu in the electrode 11, and Cu—Sn alloy, such as $Cu_6Sn_5$, is prevented from being formed at the boundary. In the same way, Sn in the solder 30 is prevented from diffusing into the electrode 21 and from reacting with Cu in the electrode 21, by the joining layer 40 including In and Ag formed along the boundary between the solder 30 and the electrode 21, and thus Cu—Sn alloy, such as $Cu_6Sn_5$, is prevented from being formed at the boundary. Thereby, the electronic device 1 can prevent generation of voids and cracks, as well as variation and decrease of joining strength, between the solder 30 and both of the electrode 11 and the electrode 21.

For example, the method illustrated in FIGS. 5A, 5B, 6A, and 6B forms the electronic device 1 in which the solder 30 and both of the electrode 11 and the electrode 21, illustrated in FIG. 3 are joined by the joining layers 40 including In and Ag.

Note that each of the solder 30a on the electrode 21 of the electronic component 20 and the solder 30 joined with the electrode 11 and the electrode 21 can be structured such that a comparatively fine second phase including In and Ag is included and dispersed in a first phase including In and Sn, for example. In this case, the first phase can include Ag, Cu, diffusing constituents from the electrode 11 and the electrode 21, unavoidable impurities, etc. in addition to In and Sn. The second phase can include Sn, Cu, diffusing constituents from the electrode 11 and the electrode 21, unavoidable impurities, etc., in addition to In and Ag. The second phase is structured such that Cu is mixed in $AgIn_2$ which is an intermetallic compound of Ag and In, and is included and dispersed in the first phase in such a manner that crystal grains of the second phase have finer sizes than the crystal grains of the first phase, for example.

Sn, In, Ag, and Cu are included as constituent elements in the solder of the solder ball 31 or the solder paste 32 (FIGS. 5A and 5B), the solder 30a on the electrode 21 (FIGS. 6A and 6B), and the solder 30 joined with the electrode 11 and the electrode 21 (FIG. 3).

For example, the solder of the solder ball 31 or the solder paste 32 includes 40 wt % to 65 wt % In, 0.01 wt % to 5 wt % Ag, and 0.01 wt % to 1 wt % Cu, and the remainder including Sn or Sn and unavoidable impurities. The material of this composition is used to form the solder 30a with which the joining layer 40 is formed along the boundary between the solder 30a and the electrode 21 of the electronic component 20, and to form the solder 30 with which the joining layers 40 are formed along the boundaries between the solder 30 and both of the electrode 11 of the electronic component 10 and the electrode 21 of the electronic component 20.

In this case, in the electronic component 20, the solder 30a and the joining layer 40 along the boundary between the solder 30a and the electrode 21 have a composition that approximately includes 40 wt % to 65 wt % In, 0.01 wt % to 5 wt % Ag, 0.01 wt % to 1 wt % Cu, and the remainder including Sn and the like, in total. Alternatively, in the electronic device 1, the solder 30 and the joining layers 40 of the electrode 11 side and the electrode 21 side have a composition that approximately includes 40 wt % to 65 wt % In, 0.01 wt % to 5 wt % Ag, 0.01 wt % to 1 wt % Cu, and the remainder including Sn and the like, in total.

The temperature of the first reflow of the solder ball 31 or the solder paste 32 (the temperature for joining the solder 30a onto the electrode 21) is set to 200° C. or less, preferably 150° C. or less. The temperature of the second reflow of the solder 30a (the temperature for joining the solder 30 onto the electrode 11 and the electrode 21) is also set to 200° C. or less, preferably 150° C. or less, in the same way. The solder 30a and the solder in the solder ball 31 or the solder paste 32 have the above composition to enable comparatively low joining temperature, such as 200° C. or less, more preferably 150° C. or less. The comparatively low joining temperature can prevent heat damage to the electronic component 20 and the electronic component 10 at the time of joining, and can reduce the electric power cost associated with heating and the production cost of the electronic component 20 (i.e., what is joined with the solder 30a) and the electronic device 1.

Figure 7:
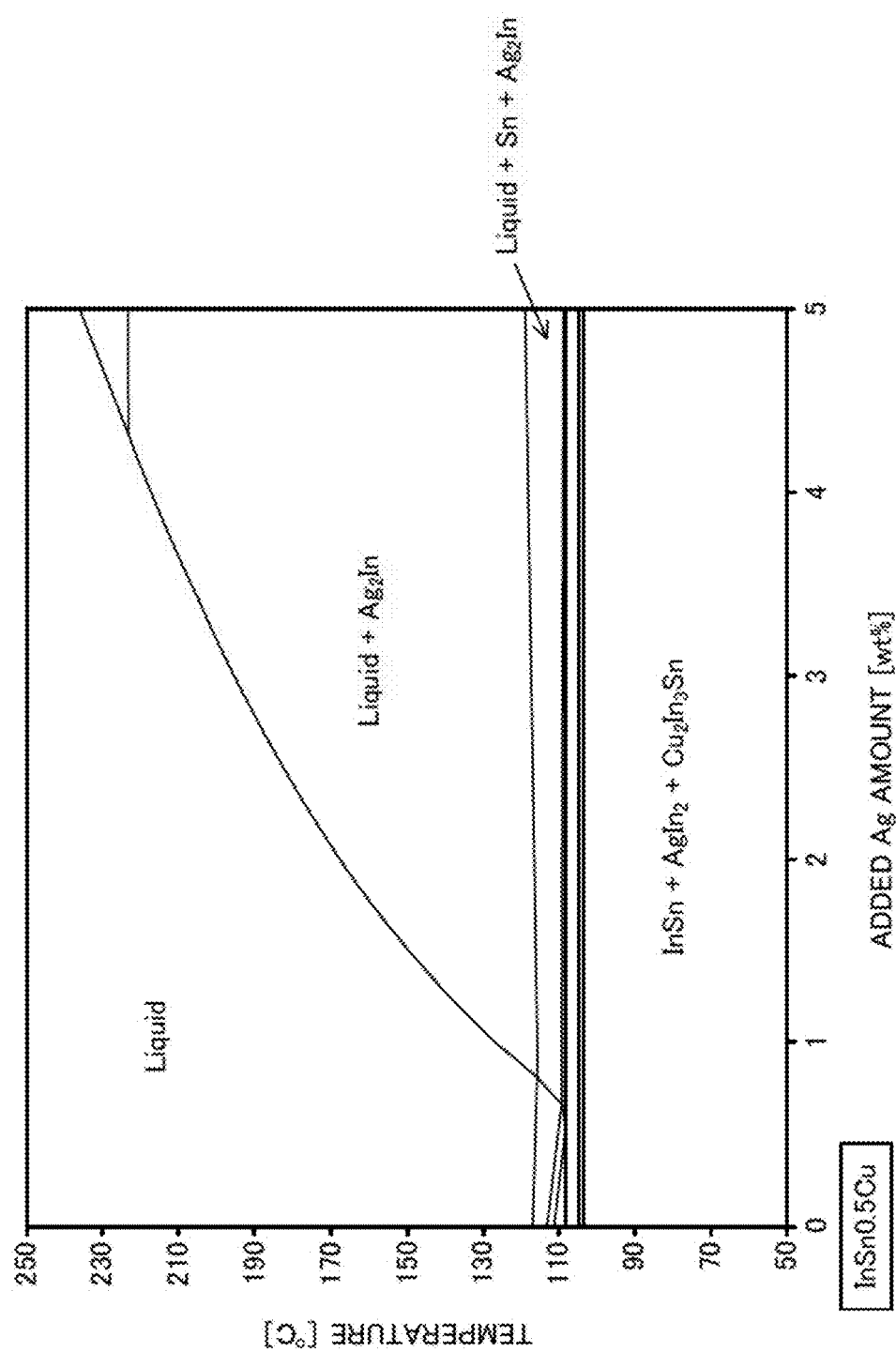
FIG. 7 illustrates an example of a computational phase diagram of In—Sn—Ag—Cu based solder.

FIG. 7 illustrates an example of a computational phase diagram of In—Sn—Ag—Cu based solder. FIG. 7 illustrates a computational phase diagram of In—Sn eutectic solder including 52 wt % In and 48 wt % Sn to which 0.5 wt % Cu is added to form In—Sn-0.5 Cu solder and then Ag is added further. In FIG. 7, the horizontal axis represents added Ag amount [wt %] with In—Sn—0.5 Cu at an origin, and the vertical axis represents temperature [° C.]. The composition at the origin of FIG. 7 is In:Sn:Ag:Cu=51.75 wt %:47.75 wt %:0 wt %:0.5 wt %. For example, when the added Ag amount is 3 wt % on the horizontal axis, the composition is expressed by In:Sn:Ag:Cu=50.25 wt %:46.25 wt %:3 wt %:0.5 wt %, and the composition ratios of In and Sn decrease according to the added Ag amount.

The solder created by adding Ag to In—Sn-0.5 Cu includes InSn, $AgIn_2$, and $Cu_2In_3Sn$, regardless of the added Ag amount, within a temperature range of 100° C. and lower. In a higher temperature range, the solder created by adding Ag to In—Sn-0.5 Cu is in a state of liquid phase, a state that includes liquid phase solder and $Ag_2In$, or a state that includes liquid phase solder, Sn, and $Ag_2In$, depending on the added Ag amount. As obvious from FIG. 7, the solder created by adding up-to-5 wt % Ag to In—Sn-0.5 Cu melts at a comparatively low temperature, such as 200° C. or less, preferably 150° C. or less, and forms AgIn$_2$ when melting and solidifying.

Figure 8:
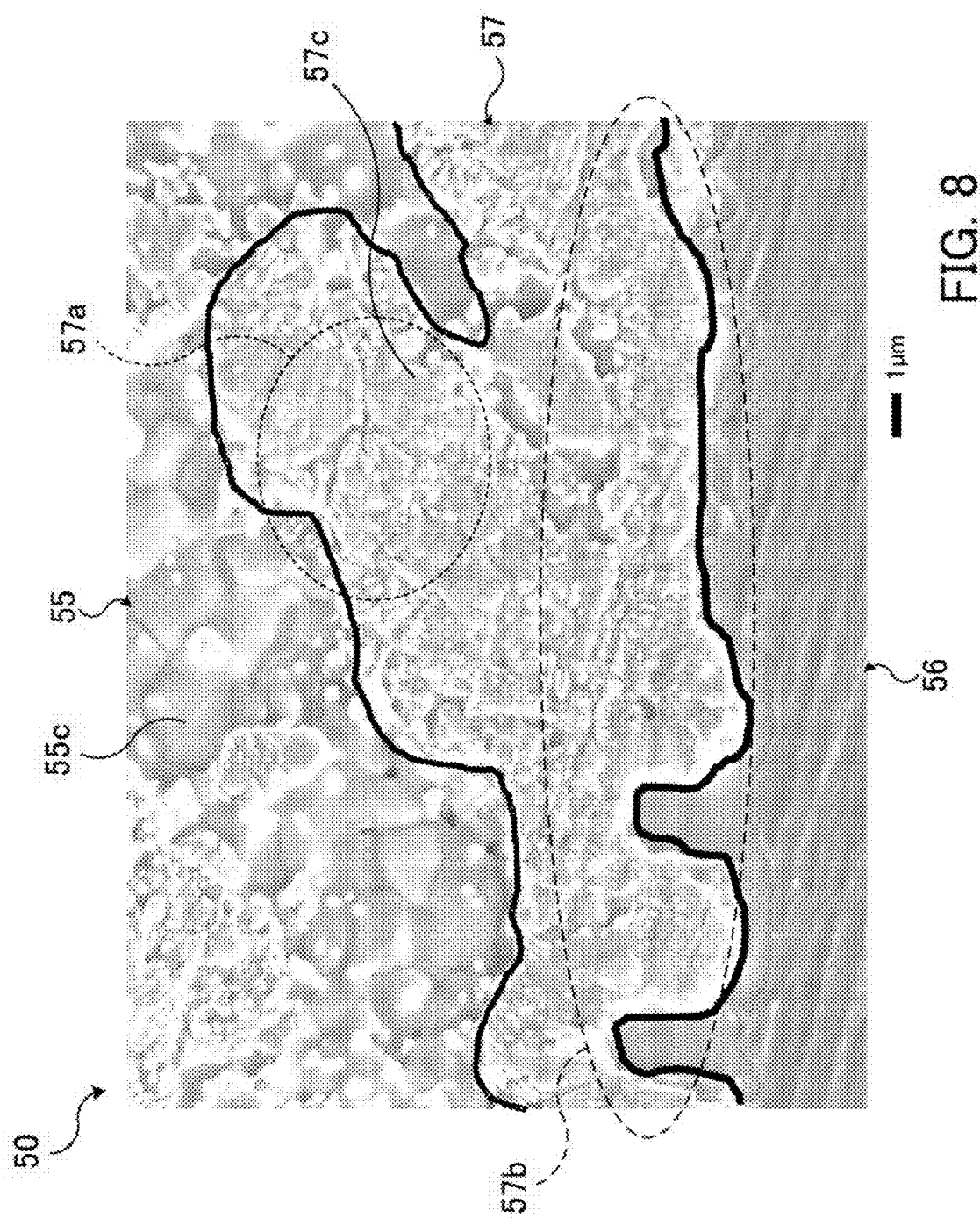
FIG. 8 illustrates an example of a scanning electron microscope image according to the first embodiment.

An example of a scanning electron microscope (SEM) image according to the first embodiment is illustrated in FIG. 8. Also, an example of an element analysis result according to the first embodiment is illustrated in FIG. 9 and table 1.

FIG. 8 illustrates a cross-sectional SEM image of a specimen created by joining a Cu electrode with In—Sn-3 Ag-0.5 Cu solder obtained by adding 3 wt % Ag and 0.5 wt % Cu to In—Sn eutectic solder. The cross-sectional SEM image includes a solder, an electrode, and a boundary therebetween. FIG. 9 illustrates element analysis results of the specimen at regions that include the solder, the electrode, and the boundary. (A) of FIG. 9 is an analysis result of Ag, and (B) of FIG. 9 is an analysis result of Cu, and (C) of FIG. 9 is an analysis result of Sn, and (D) of FIG. 9 is an analysis result of In. In FIG. 9, a region is displayed darker as the region includes a smaller amount of target element. Further, table 1 illustrates element analysis results of regions (a solder side portion and an electrode side portion) at the boundary between the solder and the electrode in the specimen.

Figure 9:
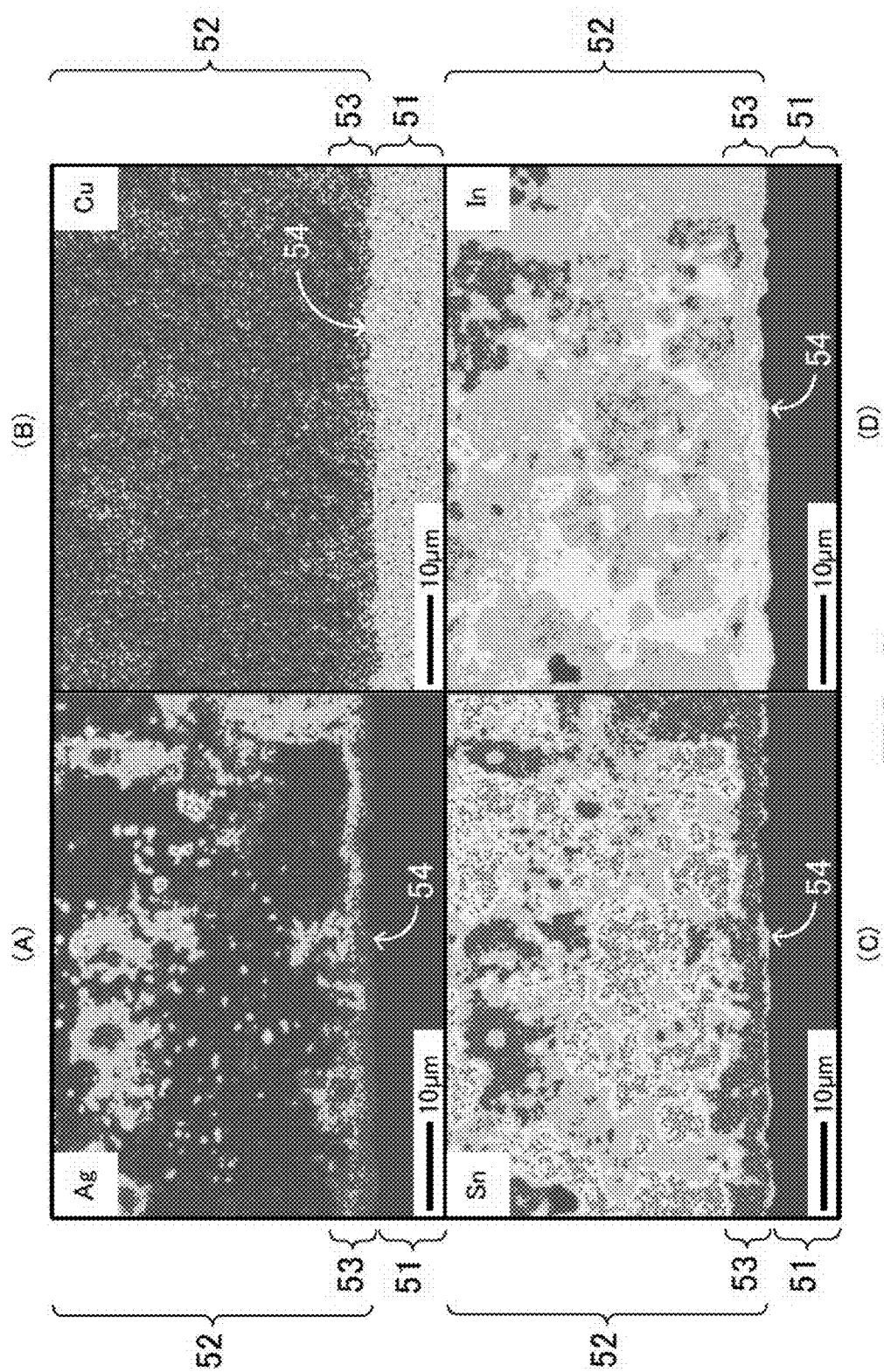
FIG. 9 illustrates an example of element analysis results according to the first embodiment.

As illustrated in (B) of FIG. 9, Cu exists in a large amount in an electrode region 51 and highly disperses in a region 52 above the electrode. As illustrated in (D) of FIG. 9, In widely exists over the region 52 above the electrode and exists in a large amount in a region 53 at the vicinity of the electrode surface. As illustrated in (A) of FIG. 9, Ag disperses in the region 52 above the electrode and exists in the region 53 at the vicinity of the electrode surface. As illustrated in (C) of FIG. 9, Sn exists in the region 52 above the electrode but is small in amount in the region 53 at the vicinity of the electrode surface, and exists in a large amount in a region 54 at the electrode surface and the region 52 above the region 53 at the vicinity of the electrode surface. In and Ag exist in the region 53 at the vicinity of the electrode surface which includes a small amount of Sn ((A) and (D) of FIG. 9).

The element analysis results of (A) to (D) of FIG. 9 indicate that a joining layer 57 including In and Ag is formed along the boundary between a solder 55 and an electrode 56 in a specimen 50 of the cross-sectional SEM image of FIG. 8. In FIG. 8, the joining layer 57 includes a fine crystal grain 57c of approximately 1 µm, which is smaller than a crystal grain 55c of the solder 55, and the average crystal grain diameter of the joining layer 57 is smaller than the average crystal grain diameter of the solder 55. The joining layer 57 has the two-layer structure illustrated in FIG. 4B, which includes a thinner Cu—Sn alloy layer formed on the surface (the region 54) of the electrode 56 and an In—Ag alloy layer that is thicker than the Cu—Sn alloy layer and is formed in the region 53 on the Cu—Sn alloy layer, as in (A) to (D) of FIG. 9.

Table 1 illustrates an example of element analysis (point analysis) results of a solder side portion 57a and an electrode side portion 57b of the joining layer 57 at the boundary between the solder 55 and the electrode 56 illustrated in FIG. 8. The electrode side portion 57b includes In, Sn, Ag, and Cu. The solder side portion 57a includes In, Ag, and Cu, but includes almost no Sn. As in this table 1 and the above element analysis results of (A) to (D) of FIG. 9, the joining layer 57 includes an In—Ag alloy layer (corresponding to the In—Ag alloy layers 42 described in FIG. 4B) that includes Cu in the solder side portion 57a, as well as a Cu—Sn alloy layer (corresponding to the Cu—Sn alloy layers 43 described in FIG. 4B) that includes In and Ag in the electrode side portion 57b.

The joining layer 57 includes Sn in the electrode side portion 57b, but includes almost no Sn in the solder side portion 57a. It is difficult for Sn in the solder 55 to diffuse toward the electrode 56 because of the solder side portion 57a (In—Ag alloy layer) of the joining layer 57, and thereby Cu—Sn alloy is prevented from being formed.

In the electrode side portion 57b of the joining layer 57, Cu probably substitutes at the site of Ag in AgIn$_2$, and Sn probably substitutes at the site of In in AgIn$_2$, and thus (In+Sn):(Ag+Cu) is approximately 2:1 in table 1.

Figure 10:
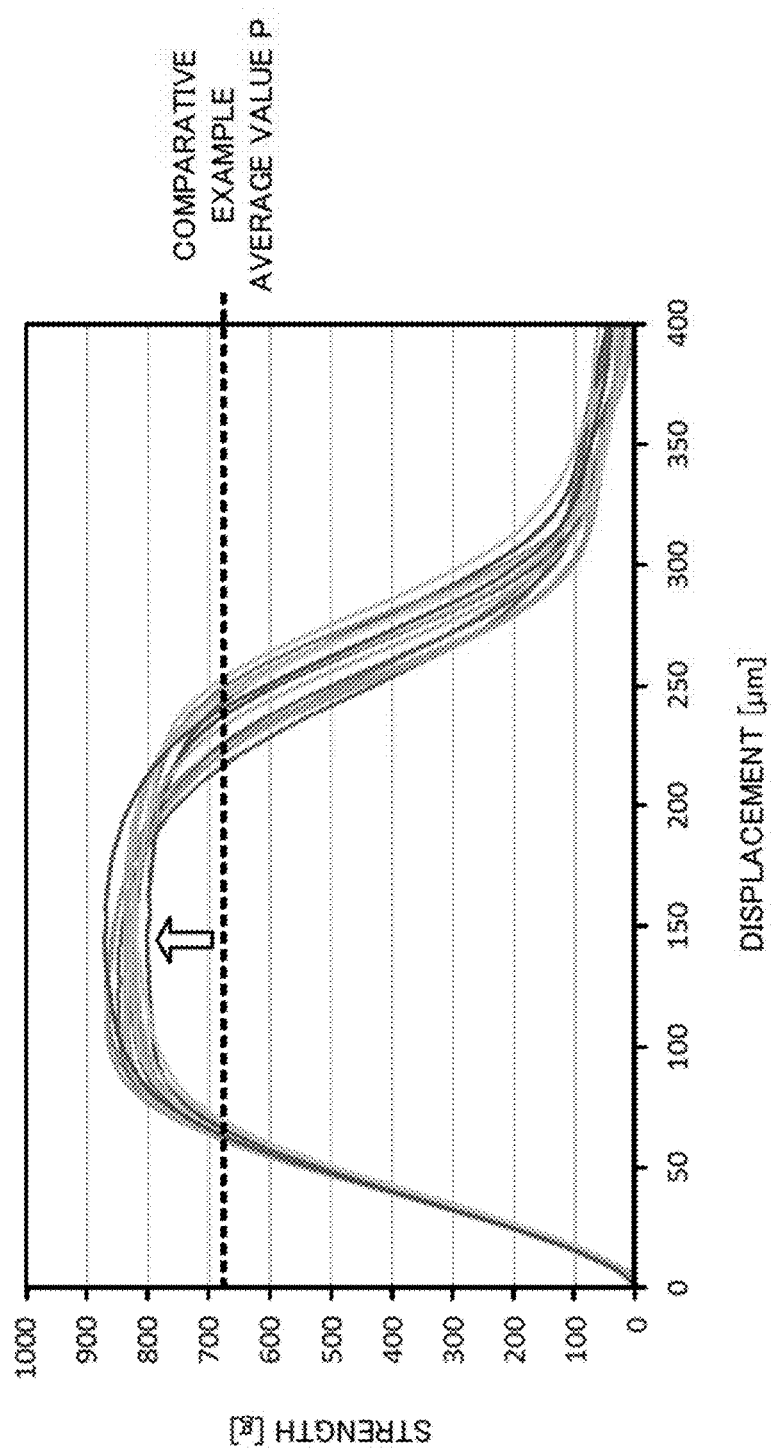
FIG. 10 illustrates an example of a high speed shear test result according to the first embodiment.

An example of a high speed shear test result according to the first embodiment is illustrated in FIG. 10. FIG. 10 illustrates a result of the high speed shear test of solder, which was performed to a specimen group in which Cu electrodes (corresponding to the above electrode 11 or the electrode 21) are joined with In—Sn-3Ag-0.5 Cu as solders including Sn (corresponding to the above solder 30a) in the same condition that joining layers including In and Ag (corresponding to the above joining layers 40) are formed along boundaries between the In—Sn-3Ag-0.5 Cu and the Cu electrodes.

The high speed shear test measures strength (load) when a solder on an electrode is broken (sheared) with a shear tool, under a condition that a shear position of the solder by the shear tool is at a height of 100 µm from the electrode and that a shear speed of the shear tool is 3000 mm/sec. In FIG. 10, the horizontal axis represents displacement [µm] of the shear tool, and the vertical axis represents strength [g].

As obvious from FIG. 10, in the specimen group that joins the solders and the electrodes in the same condition to form the joining layers including In and Ag along the boundaries, variation of peak values of strength is reduced, and variation of change behaviors of the strength associated with displacement is reduced, as compared with the result of FIG. 2. As described above, in the specimen group that forms the joining layers including In and Ag along the boundaries between the solders and the electrodes, the variation of the peak values of the strength is reduced, and all of the peak values of strength exceed an average value (illustrated as a comparative example average value P in FIG. 10) of the peak values of the strength of the specimen group that obtained the result of FIG. 2. A joint structure with high strength and reduced variation is achieved by forming the joining layer including In and Ag along the boundary between the solder and the electrode.

Further, in the specimen group that forms the joining layers including In and Ag along the boundaries between the solders and the electrodes, the strength behaves to maintain the peak value during a certain displacement, as obvious from FIG. 10. This indicates that the joint structure of the specimen group makes it difficult for a crack to propagate, so as to improve ductility.

TABLE 1

|  | In | Sn | Ag | Cu |
| --- | --- | --- | --- | --- |
| SOLDER SIDE PORTION | 61.3 |  | 23.1 | 15.6 |
|  | 60.5 |  | 21.4 | 18.1 |
|  | 62.1 |  | 23.1 | 14.8 |
| ELECTRODE SIDE PORTION | 56.0 | 13.0 | 5.5 | 25.5 |
|  | 57.6 | 12.9 | 7.7 | 21.8 |
|  | 56.0 | 13.7 | 7.3 | 23.0 |
|  | 51.5 | 17.4 | 6.4 | 24.7 |

(mol %)

The joining layer including In and Ag formed along the boundary between the solder and the electrode has a comparatively fine crystal structure (FIG. 8), thereby improving the joining strength and the ductility between the solder and the electrode to achieve a joint structure of high joint reliability.

As described above, the joint structure of high joint reliability with reduced variation of the joining strength is achieved by joining the solder and the electrode with the joining layer including In and Ag. Thereby, an electronic component that has such a joint structure, and an electronic device or an electronic apparatus that uses such an electronic component are improved in reliability and yield rate.

Here, In—Sn-3Ag-0.5 Cu obtained by adding 3 wt % Ag and 0.5 wt % Cu to In—Sn eutectic solder is illustrated as the solder, but the composition of the solder is not limited thereto. Any solder including 40 wt % to 65 wt % In, 0.01 wt % to 5 wt % Ag, 0.01 wt % to 1 wt % Cu, and the remainder including Sn can melt at 200° C. or less, particularly 150° C. or less. Also, when the solder melts and solidifies, a joining layer including In and Ag, such as a joining layer that has a two-layer structure including an In—Ag alloy layer and a Cu—Sn alloy layer or a joining layer that has a single layer structure of an In—Ag alloy layer, is formed along the boundary between the solder and the electrode.

Note that, if Ag added together with Cu (0.01 wt % to 1 wt %) to In (40 wt % to 65 wt %) and Sn of a predetermined composition becomes smaller in amount than 0.01 wt %, a comparatively coarse alloy including Cu as a main element tends to be formed in the solder, when the solder melts and solidifies. If Ag added together with Cu (0.01 wt % to 1 wt %) to In (40 wt % to 65 wt %) and Sn of a predetermined composition becomes larger in amount than 5 wt %, a comparatively coarse alloy including Ag as a main element tends to be formed in the solder, when the solder melts and solidifies. It is possible that the solder embrittles, when this comparatively coarse alloy is formed in the solder.

Also, if Cu added together with Ag (0.01 wt % to 5 wt %) to In (40 wt % to 65 wt %) and Sn of a predetermined composition becomes smaller in amount than 0.01 wt %, it is possible that sufficient solder mechanical strength is not obtained. When Cu added together with Ag (0.01 wt % to 5 wt %) to In (40 wt % to 65 wt %) and Sn of a predetermined composition becomes larger in amount than 1 wt %, it is possible that a comparatively coarse alloy including Cu as a main element is formed in the solder, so as to embrittle the solder, when the solder melts and solidifies.

Also, when In in the solder is smaller in amount than 40 wt %, and when In in the solder is larger in amount than 65 wt %, solidus temperature rises, making low temperature joining difficult.

In view of the above point, it is preferable that the solder have a composition including 40 wt % to 65 wt % In, 0.01 wt % to 5 wt % Ag, 0.01 wt % to 1 wt % Cu, and the remainder including Sn.

Figure 11:
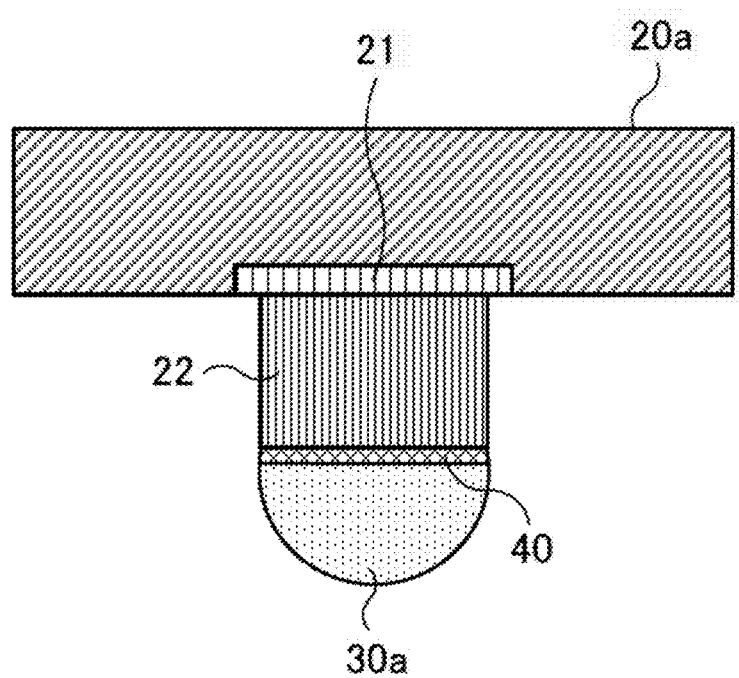
FIG. 11 illustrates an example of an electronic component according to a second embodiment.

Next, a second embodiment will be described. FIG. 11 illustrates an example of an electronic component according to the second embodiment. FIG. 11 schematically illustrates a cross section of a main part of the electronic component according to the second embodiment.

Although the above first embodiment has illustrated an example in which the solder 30a is provided on the electrode 21 of the electronic component 20, a post 22 may be provided on an electrode 21, and a solder 30a may be provided on the post 22 as in an electronic component 20a (an electronic device) illustrated in FIG. 11. Cu is included in the post 22. In the electronic component 20a, a joining layer 40 including In and Ag is formed along a boundary between the solder 30a and the post 22, as illustrated in FIG. 11, for example.

In the electronic component 20a, the joining layer 40 including In and Ag is formed along the boundary between the solder 30a and the post 22, and thereby Cu—Sn alloy, such as $Cu_6Sn_5$, is prevented from being formed at the boundary. This structure achieves the electronic component 20a that can prevent generation of voids and cracks, as well as variation and decrease of joining strength, between the solder 30a and the post 22.

Figure 12A:
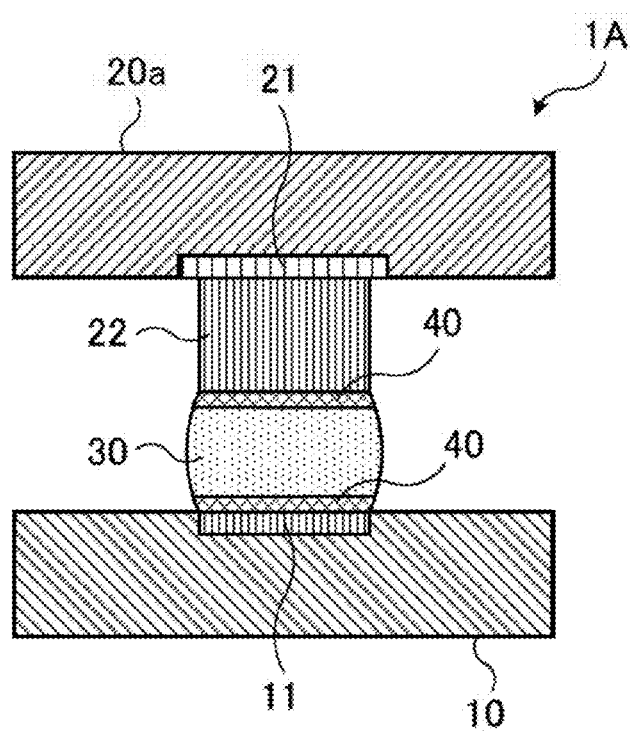
FIGS. 12A and 12B illustrate examples of the electronic device according to the second embodiment.
Figure 12B:
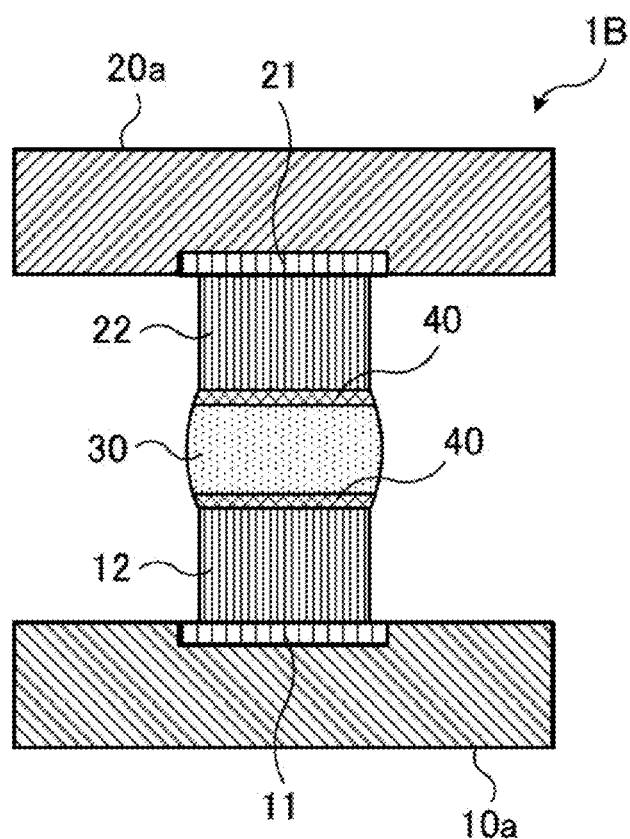

FIGS. 12A and 12B illustrate examples of the electronic device according to the second embodiment. FIG. 12A schematically illustrates a cross section of a main part of a first exemplary structure of the electronic device according to the second embodiment. FIG. 12B schematically illustrates a cross section of a main part of a second exemplary structure of the electronic device according to the second embodiment.

An electronic device 1A illustrated in FIG. 12A is structured such that the post 22 on the electrode 21 of the electronic component 20a and an electrode 11 of an electronic component 10 are joined by the solder 30, and joining layers 40 including In and Ag are formed along boundaries between the solder 30 and both of the post 22 and the electrode 11. The electronic device 1A is formed by joining and reflowing the solder 30a provided on the post 22 of the electronic component 20a illustrated in FIG. 11 with the electrode 11 of the electronic component 10.

In the electronic device 1A, the joining layers including In and Ag are formed along the boundaries between the solder 30 and both of the post 22 and the electrode 11, and thereby Cu—Sn alloy, such as $Cu_6Sn_5$, is prevented from being formed at the boundaries. This structure achieves the electronic device 1A of high joint reliability which can prevent generation of voids and cracks, as well as variation and decrease of joining strength, between the solder 30 and both of the post 22 and the electrode 11.

Note that the electronic device can be produced without the post 22 on the electrode 21 of the electronic component 20, by providing a post on the electrode 11 of the electronic component 10 and joining and reflowing a solder 30a provided on the electrode 21 of the electronic component 20 with the post provided on the electrode 11 of the electronic component 10.

In an electronic device 1B illustrated in FIG. 12B, an electronic component 10a provided with a post 12 on the electrode 11 is used. Cu is included in the post 12. The electronic device 1B is structured such that the post 22 on the electrode 21 of the electronic component 20a and the post 12 on the electrode 11 of the electronic component 10a are joined by a solder 30, and joining layers 40 including In and Ag are formed along boundaries between the solder 30 and both of the post 22 and the post 12. The electronic device 1B is formed by joining and reflowing the solder 30a provided on the post 22 of the electronic component 20a illustrated in FIG. 11 with the post 12 provided on the electrode 11 of the electronic component 10a.

In the electronic device 1B, the joining layers including In and Ag are formed along the boundaries between the solder 30 and both of the post 22 and the post 12, and thereby Cu—Sn alloy, such as $Cu_6Sn_5$, is prevented from being formed at the boundaries. This structure achieves the electronic device 1B of high joint reliability that can prevent generation of voids and cracks, as well as variation and decrease of joining strength, between the solder 30 and both of the post 22 and the post 12.

Although the first and second embodiments have been described in the above, a semiconductor chip (a semiconductor element), a semiconductor package (a semiconductor device) or a circuit substrate that includes such a semiconductor chip, or the like can be used as the above electronic components 10 and 10a and the electronic components 20 and 20a.

Note that a combination of the electronic components 10 and 10a and the electronic components 20 and 20a that are joined by the solder 30 is, for example, a combination of a semiconductor chip and a circuit substrate, a combination of a semiconductor package and a circuit substrate, and a combination of a semiconductor chip and a semiconductor package. Moreover, the combination of the electronic components 10 and 10a and the electronic components 20 and 20a that are joined by the solder 30 is, for example, a combination of semiconductor chips, a combination of semiconductor packages, and a combination of circuit substrates.

Also, the electronic components 10 and 10a and the electronic components 20 and 20a that are joined by the solder 30 may be a combination of electronic components after singulation, a combination of an electronic component before singulation and an electronic component after singulation, or a combination of electronic components before singulation.

FIGS. 13 to 16 illustrate exemplary structures of semiconductor chips, semiconductor packages, and circuit substrates that can employ the electronic components 10, 10a, 20, 20a described in the first and second embodiments.

Figure 13:
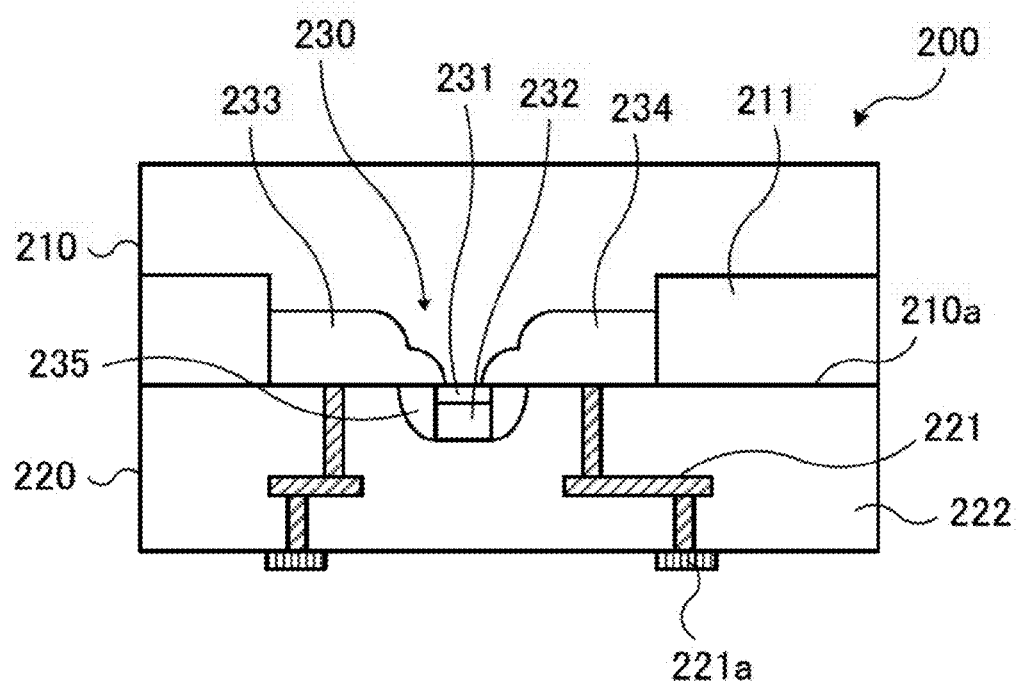
FIG. 13 illustrates an exemplary structure of a semiconductor chip.

FIG. 13 illustrates an exemplary structure of a semiconductor chip. FIG. 13 schematically illustrates a cross section of a main part of the semiconductor chip.

The semiconductor chip 200 illustrated in FIG. 13 includes a semiconductor substrate 210 provided with a circuit element, such as a transistor, and a wiring layer 220 provided on a surface 210a of the semiconductor substrate 210.

The semiconductor substrate 210 is made of silicon (Si), germanium (Ge), silicon germanium (SiGe), gallium arsenic (GaAs), and indium phosphorus (InP), for example. A circuit element, such as a transistor, a capacitor, and a resistor, is provided on the semiconductor substrate 210. FIG. 13 illustrates a metal oxide semiconductor (MOS) transistor 230 as an example.

The MOS transistor 230 is provided in an element region that is delimited by element separating regions 211 provided on the semiconductor substrate 210. The MOS transistor 230 includes a gate electrode 232 that is formed on the semiconductor substrate 210 with a gate insulating film 231 in-between, and a source region 233 and a drain region 234 that are formed in the semiconductor substrate 210 at both sides of the gate electrode 232. An insulating film spacer 235 (a side wall) is provided on a side wall of the gate electrode 232.

The wiring layer 220 is provided on the semiconductor substrate 210 provided with the MOS transistor 230. The wiring layer 220 includes conductor parts 221 (line, via, etc.) that are electrically connected to the MOS transistor 230 provided in the semiconductor substrate 210, and an insulator part 222 that covers the conductor parts 221. Various types of conductor materials, such as Cu, are used in the conductor parts 221. Inorganic insulation material, such as SiO, and organic insulation material, such as resin, can be used in the insulator part 222.

Terminals 221a including Cu are provided in the wiring layer 220 and are electrically connected to the conductor parts 221. Each of the terminals 221a is an electrode or a post that is provided on an electrode. For example, the above solder including Sn, In, Ag, and Cu is joined on the terminals 221a, and the above joining layer including In and Ag is formed along the boundary.

Figure 14A:
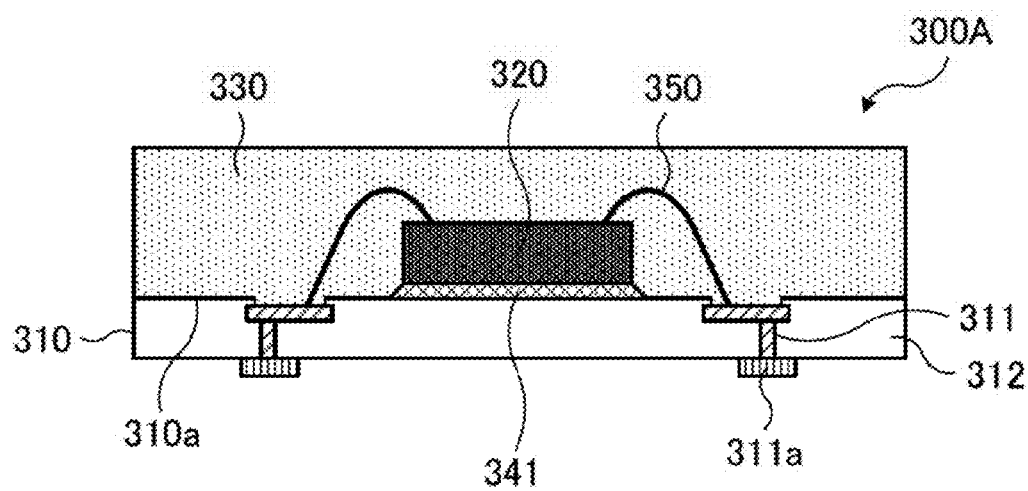
FIGS. 14A and 14B illustrate exemplary structures of semiconductor packages.
Figure 14B:
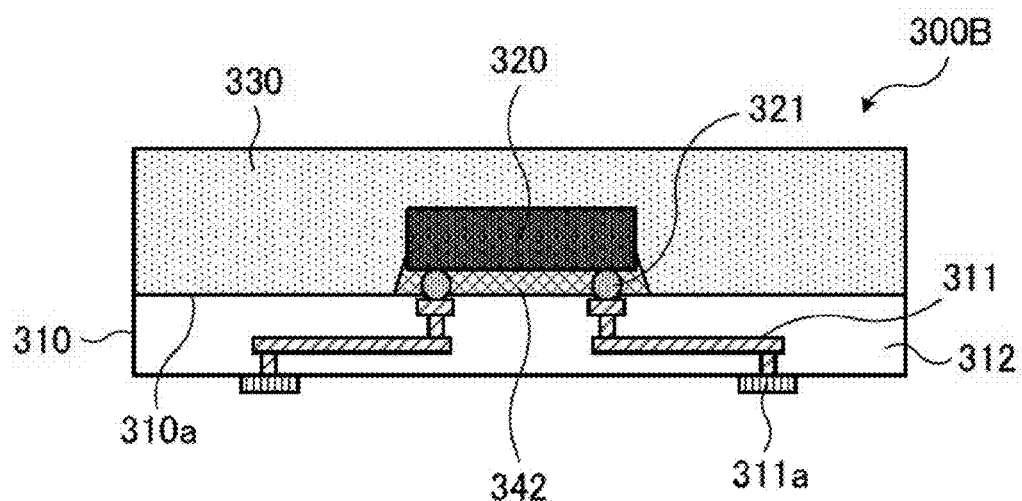

FIGS. 14A and 14B illustrate exemplary structures of semiconductor packages. FIGS. 14A and 14B schematically illustrate cross sections of main parts of the semiconductor packages.

A semiconductor package 300A illustrated in FIG. 14A and a semiconductor package 300B illustrated in FIG. 14B each include a package substrate 310, a semiconductor chip 320 mounted on the package substrate 310, and a seal layer 330 that seals the semiconductor chip 320.

For example, a print substrate is used as the package substrate 310. The package substrate 310 includes conductor parts 311 (line, via, etc.) and an insulator part 312 that covers the conductor parts 311. Various types of conductor materials, such as Cu, are used in the conductor parts 311. Resin material, such as phenolic resin, epoxy resin, and polyimide resin, and composite resin material produced by impregnating glass fibers or carbon fibers with such resin material, or the like is used in the insulator part 312.

In the semiconductor package 300A of FIG. 14A, the semiconductor chip 320 is bonded and fixed on a surface 310a of the package substrate 310 with die attach material 341, such as resin and electrically conductive paste, and is connected with wires 350. The semiconductor chip 320 and the wires 350 are sealed with the seal layer 330. Also, in the semiconductor package 300B of FIG. 14B, the semiconductor chip 320 is connected on the surface 310a of the package substrate 310 with bumps 321 made of solder or the like in a flip-chip manner. Underfill resin 342 is filled between the package substrate 310 and the semiconductor chip 320. The semiconductor chip 320 is sealed with the seal layer 330. Resin material such as epoxy resin, resin material including insulating filler, or the like is used in the seal layer 330.

Terminals 311a including Cu are provided in the package substrate 310 and are electrically connected to the conductor parts 311. Each of the terminals 311a is an electrode or a post that is provided on an electrode. For example, the above solder including Sn, In, Ag, and Cu is joined on the terminals 311a, and the above joining layer including In and Ag is formed along the boundary.

Note that, on the package substrates 310 of the semiconductor package 300A and the semiconductor package 300B, the same type or different types of semiconductor chips 320 may be mounted, or alternatively other electronic components, such as a chip capacitor, may be mounted in addition to the semiconductor chips 320.

Figure 15:
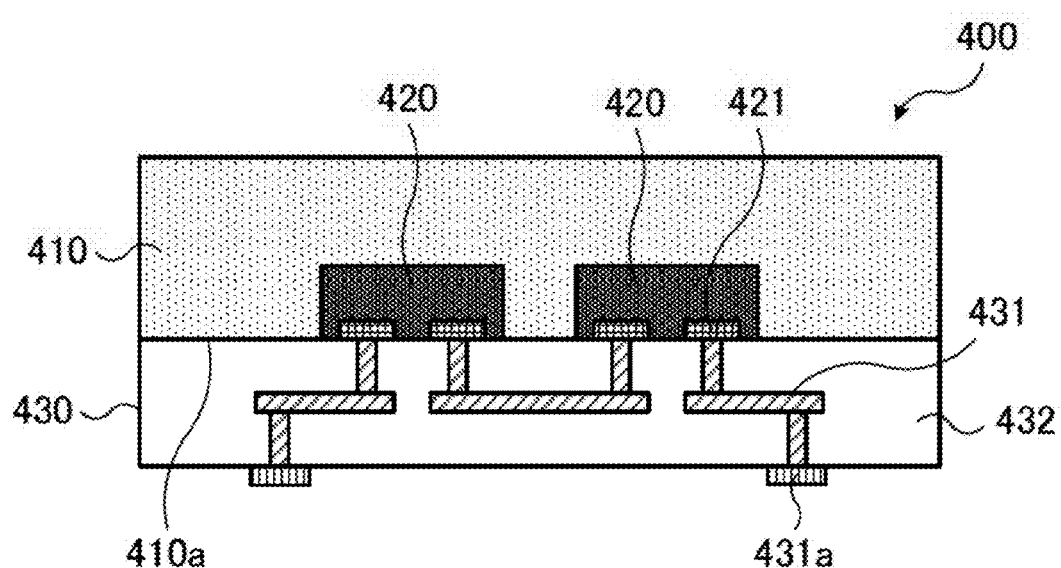
FIG. 15 illustrates another exemplary structure of a semiconductor package.

FIG. 15 illustrates another exemplary structure of a semiconductor package. FIG. 15 schematically illustrates a cross section of a main part of the semiconductor package.

The semiconductor package 400 illustrated in FIG. 15 includes a resin layer 410, the same type or different types (two in this example) of semiconductor chips 420 that are embedded in the resin layer 410, and a wiring layer 430 (a rewiring layer) that is provided on a surface 410a of the resin layer 410. The semiconductor package 400 is also referred to as pseudo SoC (System on a Chip).

Semiconductor chips 420 are embedded in the resin layer 410 in such a manner that a surface for arrangement of terminals 421 is exposed. The wiring layer 430 includes conductor parts 431 (rewiring, via, etc.) made of Cu or the like, and an insulator part 432 made of resin material that covers the conductor parts 431.

The wiring layer 430 is provided with terminals 431a that are electrically connected to the conductor parts 431. Each of the terminals 431a is an electrode or a post that is provided on an electrode. For example, the above solder including Sn, In, Ag, and Cu is joined on the terminals 431a, and the above joining layer including In and Ag is formed along the boundary.

Note that, in the resin layer 410 of the semiconductor package 400, one semiconductor chip 420 or the same type or different types of three or more semiconductor chips 420 may be embedded, and other electronic components, such as a chip capacitor, may be embedded in addition to the semiconductor chips 420.

Figure 16:
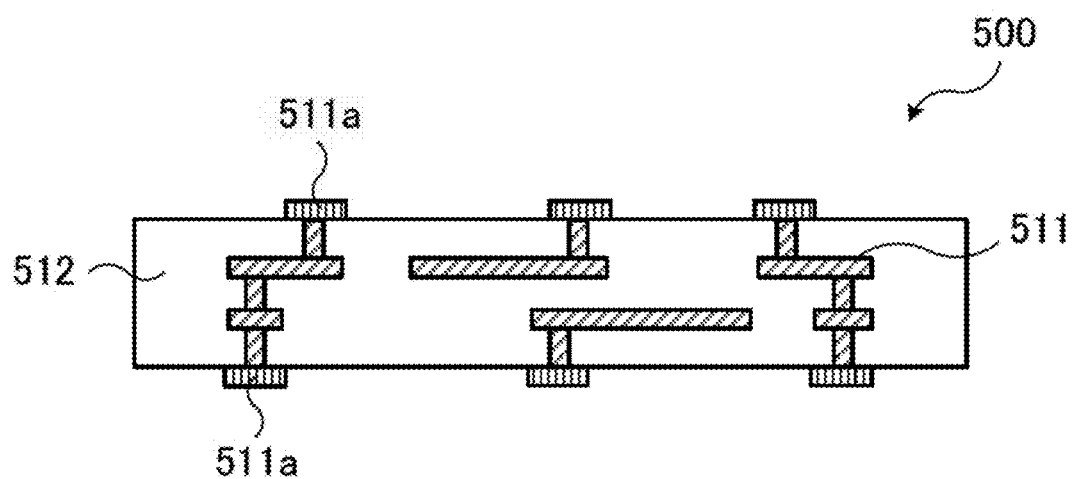
FIG. 16 illustrates an exemplary structure of a circuit substrate.

FIG. 16 illustrates an exemplary structure of a circuit substrate. FIG. 16 schematically illustrates a cross section of a main part of the circuit substrate.

FIG. 16 illustrates a circuit substrate 500a which is a multi-layer print substrate including a plurality of wiring layers. The circuit substrate 500 includes conductor parts 511 (line, via, etc.) made of Cu or the like, an insulator part 512 made of resin material that covers the conductor parts 511.

Terminals 511a are provided on both surfaces of the circuit substrate 500 and are electrically connected to the conductor parts 511. Each of the terminals 511a is an electrode or a post that is provided on an electrode. For example, the above solder including Sn, In, Ag, and Cu is joined on the terminals 511a, and the above joining layer including In and Ag is formed along the boundary.

Note that the same structure can be employed not only in the multi-layer print substrate but also in various types of circuit substrates, such as a buildup substrate that stacks line patterns and insulating layers on front and back surfaces of a core substrate, and an interposer that uses an Si substrate, an organic substrate, or a glass substrate as a base material. That is, the above solder including Sn, In, Ag, and Cu is joined on the terminal provided on the surface, and the above joining layer including In and Ag is formed along the boundary.

Various types of electronic components, such as the semiconductor chip 200 illustrated in FIG. 13, the semiconductor packages 300A, 300B, and 400 illustrated in FIGS. 14A, 14B, and 15, and the circuit substrate 500 illustrated in FIG. 16 can be employed as the electronic components 10, 10a, 20, and 20a described in the first and second embodiments.

The electronic devices 1, 1A, and 1B described in the first and second embodiments can be used in various types of electronic apparatuses. For example, the electronic devices 1, 1A, and 1B can be used in various types of electronic apparatuses, such as a computer (a personal computer, a supercomputer, a server, etc.), a smartphone, a mobile phone, a tablet terminal, a sensor, a camera, an audio device, a measurement device, a testing device, and a production device.

Figure 17:
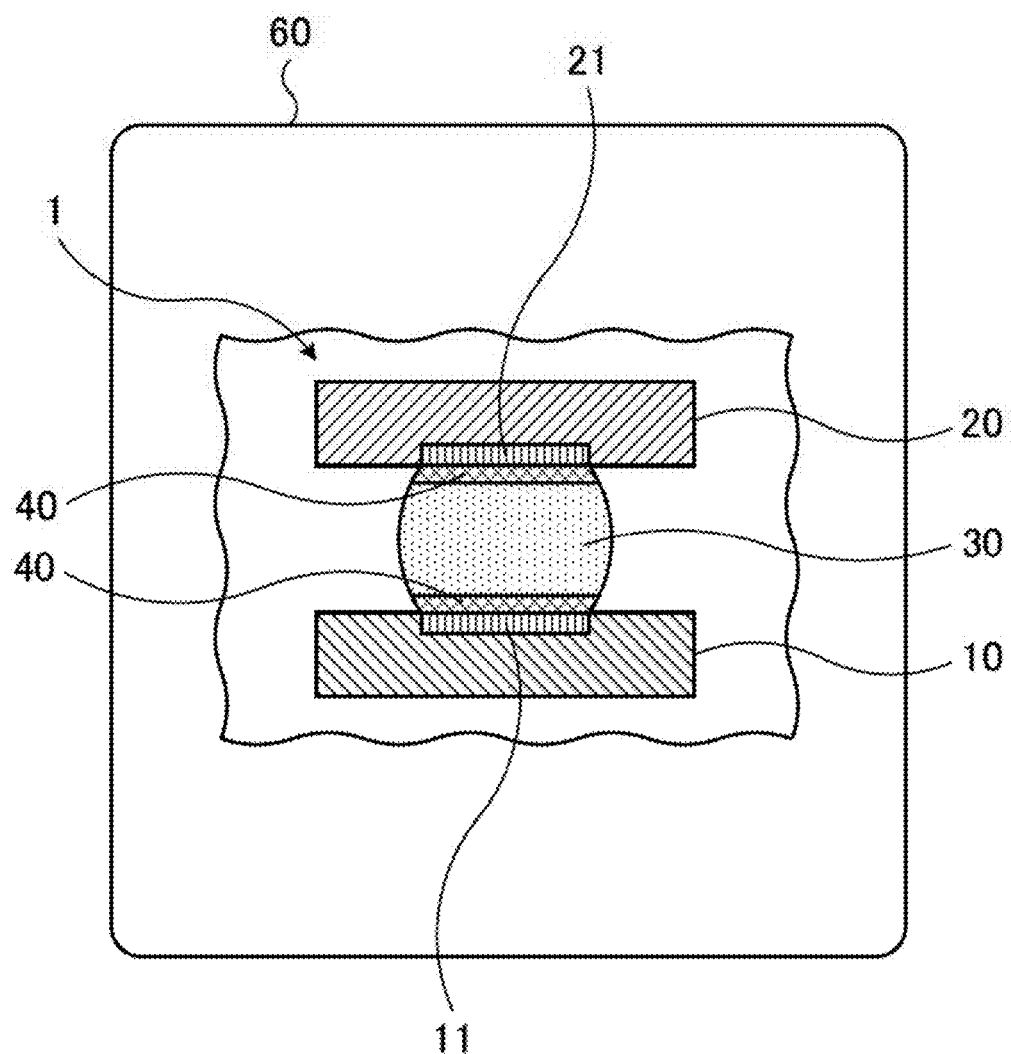
FIG. 17 illustrates an example of an electronic apparatus.

FIG. 17 illustrates an example of an electronic apparatus. FIG. 17 schematically illustrates an example of the electronic apparatus. As illustrated in FIG. 17, the electronic device 1 illustrated in FIG. 3 can be mounted inside various types of electronic apparatuses 60 mentioned above, for example.

In the electronic device 1, the joining layers including In and Ag are formed along the boundaries between the solder 30 and both of the electrode 11 and the electrode 21, in order to prevent formation of Cu—Sn alloy. This structure achieves the electronic device 1 of high joint reliability that can prevent generation of voids and cracks, as well as variation and decrease of joining strength, between the solder 30 and both of the electrode 11 and the electrode 21, and achieves the electronic apparatus 60 provided with the electronic device 1 of high reliability. Various types of electronic apparatuses provided with other electronic devices 1A and 1B can also be structured in the same manner.

The disclosed technology can provide an electronic device that is superior in joint reliability between a solder and an electrode. Also, the disclosed technology can provide an electronic apparatus that includes such an electronic device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. An electronic device comprising:
   an electrode including Cu;
   a solder including Sn and provided above the electrode; and
   a joining layer including In and Ag and provided along a boundary between the electrode and the solder, wherein
   an average crystal grain diameter of the joining layer is smaller than an average crystal grain diameter of the solder.

2. The electronic device according to claim 1, wherein the joining layer includes alloy including In and Ag.

3. The electronic device according to claim 2, wherein the alloy includes $AgIn_2$.

4. The electronic device according to claim 2, wherein the alloy includes $AgIn_2$ including Cu and Sn.

5. The electronic device according to claim 1, wherein the joining layer includes
   a first alloy layer including Cu and Sn and provided on the electrode, and
   a second alloy layer including In and Ag and provided on the first alloy layer.

6. The electronic device according to claim 5, wherein the first alloy layer is thinner than the second alloy layer.

7. The electronic device according to claim 5, wherein the first alloy layer includes $Cu_6Sn_5$ or $Cu_3Sn$.

8. The electronic device according to claim 5, wherein the first alloy layer includes Cu, Sn, and In.

9. The electronic device according to claim 5, wherein the second alloy layer includes $AgIn_2$.

10. The electronic device according to claim 5, wherein the second alloy layer includes $AgIn_2$ including Cu and Sn.

11. The electronic device according to claim 1, wherein a melting point of the solder is 150° C. or less.

12. A production method of an electronic device, comprising:
   forming solder including Sn above an electrode including Cu with a joining layer including In and Ag in-between, wherein an average crystal grain diameter of the joining layer is smaller than an average crystal grain diameter of the solder.

13. The production method of the electronic device according to claim 12, wherein the forming includes:

forming material including Sn, In, Ag, and Cu on the electrode, and forming the joining layer along a boundary between the electrode and the solder, by melting and solidifying the material on the electrode.

14. The production method of the electronic device according to claim 13, wherein the material includes Sn, 40 wt % to 65 wt % In, 0.01 wt % to 5 wt % Ag, and 0.01 wt % to 1 wt % Cu.

15. An electronic apparatus comprising:

an electronic device that includes an electrode including Cu, a solder including Sn and provided above the electrode, and a joining layer including In and Ag and provided along a boundary between the electrode and the solder, wherein an average crystal brain diameter of the joining layer is smaller than an average crystal grain diameter of the solder.

* * * * *